United States Patent [19]

Mibu et al.

[11] 4,276,479
[45] Jun. 30, 1981

[54] APPARATUS FOR CURING PHOTO-CURABLE COMPOSITION

[75] Inventors: Hiroaki Mibu, Kyoto; Tadashi Ishihara, Osaka; Chiaki Tanaka; Shingo Esaki, both of Kyoto, all of Japan

[73] Assignees: Japan Storage Battery Co., Ltd., Kyoto; Nippon Paint Co., Ltd., Osaka, both of Japan

[21] Appl. No.: 64,979

[22] Filed: Aug. 8, 1979

Related U.S. Application Data

[60] Division of Ser. No. 943,275, Sep. 18, 1978, Pat. No. 4,182,665, which is a continuation of Ser. No. 777,483, Mar. 14, 1977, abandoned, which is a continuation of Ser. No. 563,991, Apr. 1, 1975, abandoned.

[30] Foreign Application Priority Data

Apr. 1, 1974 [JP] Japan .................................. 49-37184
Sep. 25, 1974 [JP] Japan ................................ 49-110760

[51] Int. Cl.³ .............................................. B01J 19/00
[52] U.S. Cl. ............................ 250/492 R; 250/504 R
[58] Field of Search ................. 34/4; 250/504, 492 R

[56] References Cited

U.S. PATENT DOCUMENTS

| | | | |
|---|---|---|---|
| 1,856,969 | 5/1932 | Reiter et al. ........................ 250/504 |
| 2,114,173 | 4/1938 | Boerstler ............................ 250/504 |
| 2,236,397 | 3/1941 | Drummond ............................. 34/4 |

*Primary Examiner*—Harold A. Dixon
*Attorney, Agent, or Firm*—Sughrue, Rothwell, Mion, Zinn and Macpeak

[57] ABSTRACT

A photo-curable composition with high covering power provides the coating film with a glossy smooth surface when such composition is exposed firstly to light radiation having wavelengths of from about 350 nm to about 460 nm, and then to light radiation having wavelengths of from about 230 nm to about 400 nm with a specific ratio of the intensity of the former light radiation to the intensity of the latter light radiation.

13 Claims, 10 Drawing Figures

FIG. 9(a)
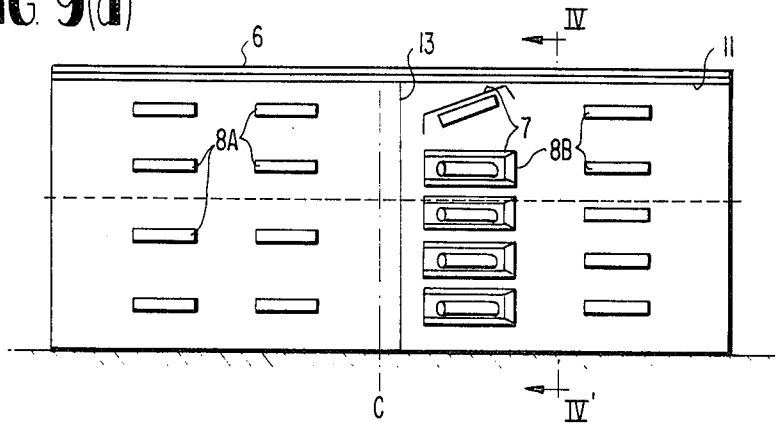
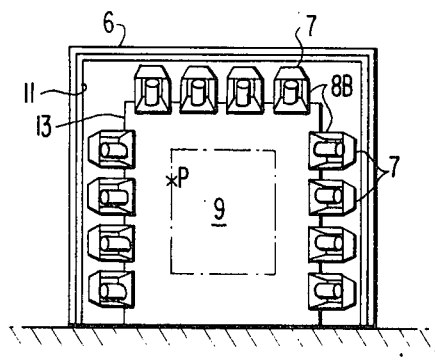
FIG. 9(b)
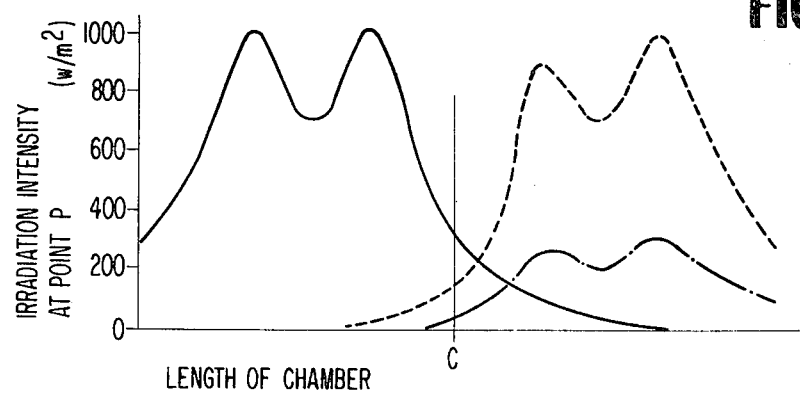
FIG. 10

APPARATUS FOR CURING PHOTO-CURABLE COMPOSITION

This is a division of application Ser. No. 943,275, filed Sept. 18, 1978, now U.S. Pat. No. 4,182,665, which is in turn a continuation of Ser. No. 777,483, filed Mar. 14, 1977, now abandoned, and in turn a continuation of Ser. No. 563,991, filed Apr. 1, 1975, now abandoned.

BACKGROUND OF THE INVENTION

1. Field of the Invention

This invention relates to a method for curing a photo-curable composition with high covering power, and also to an apparatus for practicing the method.

2. Description of the Prior Art

As for the method for curing photo-curable compositions with high covering power by exposure to ultraviolet ray energy, a Japanese document (Patent Laid Open No. 54135/1973) teaches that such a curing is possible if the intensity of ultraviolet rays is selected suitably and the type of the composition is restricted as specified as to the number of double bonds and molecular weight. However, in the case where the composition contains a large quantity of pigments with high opacity or a coated film thereof is extraordinarily thick, there is a tendency of the composition in failing to be wholly cured, or causing wrinkles on the surface. The reason for this is inferred as follows: The penetration of ultraviolet rays into the coating film is inhibited by the opaque pigments so that this can lead to differential cure and strain within the coating film, in particular between the surface portion and the deeper portion. Then, it causes either crinkles or wrinkles on the surface. For eliminating this phenomenon, the aforementioned Japanese document further teaches that the integral curing of the film of the composition can be attained by increasing the intensity of the ultraviolet rays to such an extent that the rays can reach the deepest part of the film of the composition. However, such a procedure tends to exaggerate the differential cure between the surface and deeper portions, thus causing irregularities on the surface of the film of the composition. It is, also, known that a combination of a fluorescent lamp for photo-curing use and a high-pressure mercury lamp may be employed in curing a photo-curable coating composition having a good ultraviolet ray transmittance, but this method is not suitable for curing a photo-curable coating composition containing a large quantity of pigments with high opacity. That is, two different kinds of light source have nearly the same dominant wavelengths, and a difference in the intensity of the two radiation is utilized. The irradiation intensity of the fluorescent lamp for photo-curing use is so weak in penetrating the photo-curable composition with high covering power that a differential cure between the surface and the deeper portion of the coating film is caused and then coating film have the appearance of crinkles or wrinkles as mentioned above results.

SUMMARY OF THE INVENTION

With the above described difficulties in the conventional method in view, a primary object of the invention is to provide a method and apparatus for curing the film of the compositions by irradiating of ultraviolet rays, wherein any restriction posed on the kind of the compositions can be eliminated, and the uniform curing thereof can be realized without crinkles and wrinkles or the like occurring on the surface of the composition.

Another object of the invention is to provide a method and apparatus for curing the film of the compositions by irradiation of ultraviolet rays, wherein no excessive intensity of the irradiation thereof is required.

Still another object of the invention is to provide a method and apparatus for curing the film of the compositions with high covering power wherein discoloration thereof is substantially minimized.

An additional object of the invention is to provide a method and apparatus for curing the film of the compositions by ultraviolet rays, wherein the curing can be achieved by an economized power and in a shorter period.

These and other objects hereinlater made apparent can be achieved by a method for curing photo-curable compositions by the irradiation of ultraviolet rays, comprising the steps of irradiating the compositions with an irradiation intensity $E_A$ from a light source A by the rays out of which wavelengths shorter than 300 nm are substantially eliminated and which have an abundance of radiation energy in a range of from about 350 to about 460 nm, and then irradiating the film of the compositions with an irradiation intensity $E_B$ from a light source B by the rays having an abundance of radiation energy in a range of from about 230 to about 400 nm in wavelength, with the ratio $E_A/E_B$ being maintained in a range of from 0.01 to 20.

In another aspect of the invention, the above-mentioned objects of the invention can be achieved by an apparatus for curing photo-curable compositions by the irradiation of ultraviolet rays, said apparatus comprising a tunnel type irradiation chamber, the group of light sources provided in the forward stage of the chamber for irradiating the film of the composition with an irradiation intensity by the rays out of which those having wavelengths shorter than 300 nm are substantially eliminated and which have an abundance of radiation energy in a range of wavelength from about 350 to about 460 nm, and the group of light sources provided in the rear stage of the chamber thereby to irradiate the film of the composition by the rays having an abundance of radiation energy in a wavelength range of from about 230 to about 400 nm, and wherein a ratio of a maximum irradiation intensity Ec for the entire wavelengths less than 300 nm of the rays from both groups of the light sources against a maximum irradiation intensity Ea of the rays from the first group of the light sources, that is Ec/Ea, is selected to a value 0.1 and less than 0.1.

The invention will be more clearly understood from the detailed description of the invention with respect to various examples thereof when read in conjunction with the accompanying drawings.

BRIEF DESCRIPTION OF THE DRAWINGS

In the drawings:

FIGS. 9(a) and 9(b) are a longitudinal section and a cross section along the line IV—IV' of still another embodiment of this invention, respectively; and FIG. 10 is a diagram showing a distribution of irradiation intensity on a point P along the longitudinal direction of the device shown in FIGS. 9(a) and 9(b).

DETAILED DESCRIPTION OF THE INVENTION

Figure 1:
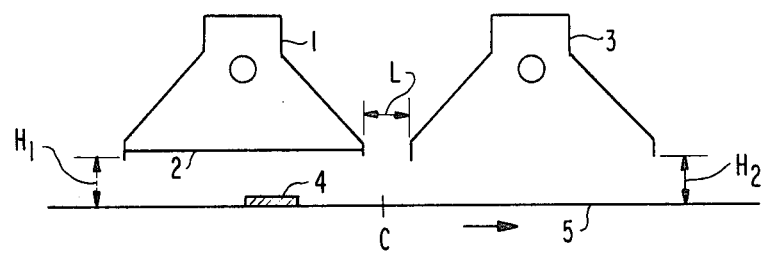
FIG. 1 is a front elevational view of an experimental device for obtaining data used for explaining the present invention.

For overcoming the above described drawbacks of the conventional method and for the achievement of the aforementioned objects of the invention, we studied intensively the relation between the irradiation intensity and the wavelength of the irradiated rays, and found that the uniform curing of the film of the composition with smooth surface and without discoloration can be obtained when the composition is first exposed to ultraviolet rays in a specific wavelength range as described with an irradiation intensity $E_A$ and then exposed to ultraviolet rays in another specific wavelength range also hereinbefore described with an irradiation intensity $E_B$, wherein $E_A/E_B$ is in a range of from 0.01 to 20, $E_A$ is not less than 55 W/m$^2$, and $E_B$ is not less than 135 W/m$^2$. When the irradiation intensities $E_A$ and $E_B$ of the ultraviolet rays are lower than 55 W/m$^2$ and 135W/m$^2$, respectively, the photo-curable composition to be coated cannot be cured at all, or if cured, it takes a long period for the curing. When the ratio $E_A/E_B$ is out of the above described range, the gloss of the coated the film of the composition will be lost or the coated surface by the composition will be crinkled and wrinkled with simultaneous discoloration of the coating film. It is also found that chemical fluorescent lamps for photo-curing use cause the same disadvantageous features because of the low irradiation intensity.

As for the light sources A employed in the device according to the present invention, any lamp which can emit wavelengths in a range adapted to cure the photo-curable composition may be used. Such lamps are modified mercury lamps and can emit a radiation of a dominant wavelength in a range of from about 300 to about 460 nm, preferably from about 350 to about 460 nm, by adding to the mercury or substituting for part of the mercury, one or more metals and/or metallic compounds. The metal and the metal of the metallic compound is a member or a combination of members selected from the group comprising gallium, indium, lead, aluminum, tin, cadmium, chromium, cerium, cobalt, lanthanum, magnesium, manganese, molybdenum, nickel, niobium, scandium, strontium and thorium, vanadium, and zinc, preferably gallium, indium, lead, aluminum, tin and cadmium. The preferred form of the metallic compound is a metal halide, preferably a metal iodide. Such a lamp is generally called a "metal halide lamp". The light having a wavelength less than 300 nm tends to cause phenomena similar as in the case of $E_A/E_B$ being less than 0.01, and hence not suitable for the curing method according to this invention. The wavelengths less than 300 nm can be eliminated by selecting the substances sealed into a lamp suitably, setting the vapor pressure in the lamp to a suitable value, and by attaching an outer tube of a shielding nature to the lamp. Besides the above described metal halide lamps, high pressure mercury lamps may also be used for the light sources A in the device of this invention.

As for the light source B of the device according to this invention, mercury lamps of high or medium pressures may be ordinarily used, and these lamps are preferably employed with an ozone-free quartz tube or attached with outer tube of a special ultraviolet ray-transmitting glass not transmitting ultraviolet rays having wavelengths less than 230 nm for protecting human body from these harmful rays. Furthermore, xenon lamps, metal halide lamps, and carbon arc lamps may be used instead of the above described mercury lamps for the light source B in the device of this invention.

The photo-curable composition to be cured according to this invention may comprise essentially a resin having double bonds such as unsaturated polyester, unsaturated polyurethane, unsaturated acrylic resin, unsaturated epoxide resin, and the like; a photo-sensitizer such as benzoin and benzoinether; a pigment; and a polymerizable monomer. It desired, a filler, additive, and a photo-inactive diluent may further be added to the above described composition. It is of course possible that a transparent or semi-transparent composition containing no pigment is cured according to this invention. The photo-curable composition cured may be prepared by conventional method.

The unsaturated polyester resin may be prepared by the reaction of an unsaturated mono- or poly-carboxylic acid and/or an anhydride and/or an ester thereof with an unsaturated or saturated polyalcohol or a saturated mono- or poly-carboxylic acid and/or an anhydride and/or an ester thereof with an unsaturated polyalcohol and, when desired, an unsaturated or saturated epoxy compound. The unsaturated or saturated, mono- or poly-carboxylic acid and its anhydride include, for example, fumaric, itaconic, isophthalic, adipic or sebacic acid or maleic, succinic, phthalic dodecenyl succinic or tetrahydrophthalic anhydride. The unsaturated or saturated polyalcohol includes, for example, ethylene glycol, propylene glycol, diethylene glycol, dipropylene glycol, trimethylol propane, 1,2-, 1,3- or 1,4-butandediol, 1,6-hexanediol, 1,10-decanediol, 1,2,6-hexanetriol, pentacrythritol, bisphenoldioxyethylether, bisphenoldioxypropylether, sorbitol, sucrose or bis(2-hydroxyethyl)maleate. The unsaturated or saturated epoxy compound includes, for example, n-butyl-glycidylether, allylglycidylether, a glycidyl tertiary alkanoate ("Cardura E" trademark of Shell Chemical Corp.) or di(methylglycidyl) esters of dicarboxylic acids and derivatives thereof "Epiclon" trademark of Dainippon Ink & Chemicals, Inc.).

The unsaturated polyurethane resin may be prepared by the reaction of a polyol such as, for example, polyesterpolyol, polyetherpolyol, acrylpolyol, epoxypolyol or polyurethanepolyol with a double-bonded isocyanate derivative; the isocyanate group of a polyurethane resin with an unsaturated compound having an active hydrogen atom such as, for example, a polymerizable unsaturated carboxylic acid, alcohol or amine; the hydroxyl group of a polyurethanepolyol with an unsaturated or saturated carboxylic acid or an anhydride thereof and, when desired, an unsaturated or saturated epoxy compound; and the carboxyl group of a polyurethane resin with an unsaturated or saturated epoxy compound and, when desired, an unsaturated or saturated, mono- or poly-carboxylic acid. Said polyesterpolyol may be prepared, for example, by reacting a polyol as described hereinabove under polyalcohols and said epoxy compound and said polycarboxylic acid or by reacting said epoxy compound with said polycarboxylic acid or by reacting said polyol with said polycarboxylic acid or by reacting the carboxyl group of said polyesterpolyol with a polymerizable unsaturated epoxy compound such as, for example, glycidyl methacrylate or allylglycidylether or by reacting the epoxy group of said polyesterpolyol with a polymerizable unsaturated carboxylic acid such as, for exmple, acrylic or methacrylic acid. Said acrylpolyol is a homopolymer of alkylene glycol monoacrylate or monomethacrylate or a copolymer thereof with a polymerizable monomer such as, for example, styrene, dibutyl fumarate, acrylic acid, methacrylic acid, acrylic ester, methacrylic ester, glycidyl methacrylate, ethylene, propylene, vinyl chloride, vinylidene chloride, butadiene, isoprene and vinyl acetate; a polyol prepared by the reaction of the hydroxyl group present in the side chain of an acrylic polymer with a poly-carboxylic acid or an anhydride thereof and, when desired, with an epoxy compound as described hereinabove; a polyol prepared by the reaction of the epoxy group present in the side chain of an acrylic polymer with a mono- or poly-carboxylic acid and, when desired, with an epoxy compound as described hereinabove; or a polyol prepared by the reaction of the carboxyl group present in the side chain of an acrylic polymer with an epoxy compound and, when desired, with a mono- or poly-carboxylic acid or an anhydride thereof, as described hereinabove. Said polyetherpolyol is a polyol obtained by the addition of an alkylene oxide such as, for example, ethylene oxide, propylene oxide and tetrahydrofuran to a polyol such as, for example, ethylene glycol, diethylene glycol, propylene glycol, dipropylene glycol, glycerol, trimethylol propane, 1,3-butanediol, 1,4-butanediol, 1,6-hexanediol, 1,2,6-hexanetriol, pentaerythritol, sorbitol, sorbitan or sucrose. Said epoxypolyol is a polyol obtained by the reaction of a polycarboxylic acid or a polyamine or a polyol with an epoxy compound, as described hereinabove. Said polyurethanepolyol is a polyol obtained by the urethanation of the above-mentioned polyol compound such as polyesterpolyol, polyetherpolyol, acrylpolyol, epoxypolyol or a polyol such as, for example, ethylene glycol or dimethylene glycol with a polyisocyanate. Said polymerizable double-bonded isocyanate derivative includes, for example, a diisocyanate, a triisocyanate or other polyisocyanates such as, for example, ethylene diisocyanate, propylene dissocyanate, tetramethylene diisocyanate, xylylene diisocyanate, tolylene diisocyanate or 4,4'-methylenebis(phenylisocyanate) or an isocyanate prepared by addition reaction between said isocyanate and a lower molecular weight polyol such as, for example, ethylene glycol, propylene glycol, hexamethylene glycol, trimethylol propane, hexanetriol, glycerin, sorbitol, sucrose or pentaerythritol or a polyisocyanate having a biuret structure or a polyisocyanate having an allophanate structure. Said unsaturated compound having an active hydrogen atom includes, for example, a polymerizable unsaturated carboxylic acid, alcohol or amine, e.g., allyl alcohol, 2-hydroxyethyl acrylate, 2-hydroxyethyl methacrylate, polyethyleneglycol monoacrylate, polypropyleneglycol monomethacrylate, monomethylaminoethyl methacrylate or mono- ethylaminoethyl acrylate. The other compounds to be used for this purpose are described hereinabove.

The unsaturated acrylic resin may be prepared by reacting the hydroxyl group present in the side chain of an acrylic polymer with an unsaturated or saturated, mono- or poly-carboxylic acid or an anhydride thereof and/or an unsaturated or saturated epoxy compound, as described hereinabove or by reacting the epoxy group in the side chain of an acrylic polymer with an unsaturated or saturated, mono- or poly-carboxylic acid or an anhydride thereof and/or an unsaturated or saturated epoxy compound, as described hereinabove or by reacting the carboxyl present in the side chain of an acrylic polymer with an unsaturated or saturated epoxy compound and, when desired, an unsaturated or saturated mono- or poly-carboxylic acid or an anhydride thereof, as described hereinabove. Said acrylic polymer is any acrylic polymer having as a basic unit a residue derived, for example, from acrylic or meth-acrylic acid or a derivative thereof.

The unsaturated epoxy resin may be prepared by the reaction of the hydroxyl group and/or epoxy group of an epoxy polymer prepared by the reaction of, for example, a phenol with epichlorohydrin, with an unsaturated or saturated carboxylic acid or an anhydride thereof as described hereinabove and, when desired, an unsaturated or saturated, mono- or polyepoxy compound as described hereinabove.

The unsaturated alkyd resin may be prepared by poly-condensing a polyalcohol and a poly-carboxylic acid or an anhydride thereof, as described hereinabove, and further by modifying the resulting alkyd resin with a modifier. The modifier includes, for example, an aliphatic acid, e.g., lauric, oleic, stearic, linoleic or linolic acid or a mixture thereof.

The photo-sensitizer to be used for the photo-curable coating composition of the present method may be a conventional one such as benzoin, benzoin ethers, benzophenone, benzil, 2,4- dichlorobenzaldehyde or disulphides. The photo-sensitizer may be used alone or in combination.

The coloring agent to be used for the photo-curable coating composition of the present method may be a conventional one and may be selected depending upon the use of the photo-curable coating composition.

The coating compositions thus obtained may be applied onto a substrate according to conventional methods. If necessary, the coated substrates are then allowed to stand and thereafter irradiated with an ultraviolet radiation according to the method of the present invention. The coating film thus obtained has a high covering power and good desired shade with a smooth and very glossy surface having neither crinkles nor wrinkles. The coating film thus obtained is also tougher and harder than that obtained by conventional methods. Thus, the coating composition of the present method can find use in a very wide variety of the coating fields and makes it possible to select the kind and amount of coloring agents more widely than conventional photo-curing methods can do. The photo-curing method of the present invention permits complete curing in the order of minutes and is applicable to an industrial-scale production and manufacture.

The invention will now be described more concretely with reference to reference examples and embodimental examples of this invention. In the description, "part" means weight part and the reference examples are examples of production of photo-curable coating compositions which can be cured according to this invention.

REFERENCE EXAMPLE 1

A mixture of 180 parts of xylylene diisocyanate (a mixture of ω, ω'-diisocyanato-1,3-dimethylbenzene and ω,ω'-diisocyanato-1,4-dimethylbenzene) and 0.16 part of hydroquinone was introduced into a flask equipped with a stirrer. The mixture was stirred and simultaneously cooled with water so that the temperature remained below 70° C. A mixture of 130 parts of 2-hydroxyethyl methacrylate, 0.63 part of dibutyl tin dilaurate and 0.16 part of hydroquinone was added dropwise to the mixture over a period of about 1.5 hours, and the reaction mixture was aged for about 30 minutes to give an isocyanate compound having a polymerizable double bond.

REFERENCE EXAMPLE 2

A mixture of 296 parts of phthalic anhydride, 304 parts of tetrahydrophthalic anhydride, 292 parts of adipic acid, 62 parts of ethylene glycol, 490 parts of a glycidyl tertiary alkanoate ("Cardura E" trademark of Shell Chemical Corp.), 720 parts of "Epiclon 400" (molecular weight, 360; epoxy equivalent, 180; trademark of Dainippon Ink & Chemicals, Inc.), and 73.4 parts of toluene was charged into a flask equipped with a stirrer and reacted at 150° C. under a nitrogen atmosphere until the acid value became 58 or less to give a polyester polyol. After the temperature was reduced to 130° C., 284 parts of glycidyl methacrylate, 12 parts of triphenyl phosphite and 1.2 parts of hydroquinone were added to the mixture until the acid value became 10 or less to give an unsaturated polyester prepolymer.

REFERENCE EXAMPLE 3

To 2534.6 parts of the unsaturated polyester prepolymer prepared in Reference Example 2 which had been introduced into a flask equipped with a stirrer and stirred at 110° C. under a nitrogen atmosphere was added dropwise 1244 parts of the isocyanate compound prepared in Reference Example 1 over a period of about 1 hour, and the mixture was reacted for 3 to 10 hours. After confirming the reaction of the isocyanate groups by the infra-red spectrophotometry, 368 parts of butyl acetate and 1.4 parts of hydroquinone were added to the mixture to give a urethane-modified polymerizable composition.

REFERENCE EXAMPLE 4

A mixture of 156 parts of glycidyl methacrylate and 0.24 parts of hydroquinone was introduced into a flask equipped with a stirrer. To this mixture, a mixture of 86 parts of methacrylic acid and 0.12 parts of dibutyl tin dilaurate was added dropwise over a period of about 2 hours at a temperature of 100° to 115° C. under a nitrogen atmosphere, and the resulting mixture was reacted at the same temperature until the acid value became 2 or less to give a glycerol dimethacrylate.

REFERENCE EXAMPLE 5

A mixture of 292 parts of adipic acid, 304 parts of tetrahydrophthalic anhydride, 1064 parts of dodecenylsuccinic acid anhydride, 62 parts of ethyreneglycol, 980 parts of "Cardura E", 720 parts of "Epiclon 400", 1.85 parts of dibutyl tin dilaurate, and 111.2 parts of toluen was charged into a flask equipped with a stirrer and reacted at 150° C. under a nitrogen atmosphere until the acid value became 39 or less, and then after the temperature was reduced to 130° C., 284 parts of glycidylmethacrylate, 1.85 parts of hydroquinone, were added and the reaction was effected at 130° C. until the acid value became 10 or less to give an unsaturated polyesterpolyol of molecular weight about 3422.

REFERENCE EXAMPLE 6

A mixture of 180 parts of xylylene diisocyanate, 0.21 part of hydroquinone and 50 parts of butylacetate was introduced into a flask equipped with a stirrer. With this mixture, a mixture of 242.46 parts of glycerol dimethacrylate prepared in Reference Example 4, 0.21 part of hydroquinone, 0.63 part of dibutyl tin dilaurate and 50 parts of butyl acetate was reacted in the same manner as described in Reference Example 1 to give an isocyanate compound having a polymerizable double bond.

REFERENCE EXAMPLE 7

A mixture of 4765.4 parts of the unsaturated polyester polyol obtained in Reference Example 5, 488.3 parts of the isocyanate compound obtained in Reference Example 1 and 1272.2 parts of the isocyanate compound obtained in Reference Example 6 was reacted in the same manner as described in Reference Example 3 to give a urethane-modified unsaturated polyester composition of the molecular weight about 5184.

REFERENCE EXAMPLE 8

A mixture of 288 parts of 2-hydroxypropyl acrylate, 152 parts of tetrahydrophthalic acid anhydride, 266 parts of dodecenyl succinic acid anhydride, 360 parts of "Epiclon 400", 2.2 parts of dibutyl tin dilaurate, 2.2 parts of hydroquinone and 270 parts of butylacetate was charged into a flask equipped with a stirrer and reacted at 120° C. under a nitrogen atmosphere until the acid value became 10 or less to give an unsaturated polyester composition of the molecular weight about 918.

EXAMPLE 1

75 parts of a urethane modified unsaturated polyester resin composition obtained in Reference Example 7, 50 parts of urethane modified polymerizable composition obtained in Reference Example 3, 25 parts of trimethylolpropane trimethacrylate, 2.5 parts of benzil, 1.25 parts of benzoinmethylether, and 32.5 parts of butyl acetate, 37.5 parts of titanium oxide (Tipaque R-930, manufactured by Isihara Industry Co.) were dispersed such that the particle size thereof was less than 10 microns and a coating composition was thereby obtained. The composition was applied on a tin plate with the use of a wire wound rod so that a thickness of the dried film falling within a range of from 35 to 40 microns could be obtained. The coated sample was allowed to stand for about 20 minutes at a temperature of 20° C., and then irradiated by a metal halide lamp (power consumption of 1.8 KW, arc length: 15 cm; inner diameter of the tube: 24 mm; sealed-in materials: mercury, gallium halide, and indium halide) and a high-pressure mercury lamp (power consumption of 1.8 KW; arc length: 15 cm; inner diameter of the tube: 24 mm) at various irradiation intensities $E_A$ and $E_B$ and various ratios thereof, so that the curing state of the coated film was observed in relation to the varied state of irradiation. The observed results are indicated in Table 1.

microns, and a red coating composition was obtained. The composition was applied in the same manner as in Example 2 and cured. The curing condition and the observed result were shown in Table 2.

EXAMPLE 4

TABLE 1

| Irradiation intensity ratio $E_A/E_B$ | Irradiation intensity of metal halide lamp (W/m$^2$) | Irradiation intensity of high-pressure mercury lamp (W/m$^2$) | Irradiation time (sec.) metal halide lamp | Irradiation time (sec.) High-pressure mercury lamp | Observed Result Surface condition | Observed Result Hardness (note 1) | Observed Result Solvent resistance (note 2) |
|---|---|---|---|---|---|---|---|
|   |   | 189 | 0 | 240 | tacky | 3B | Δ |
|   |   | 540 | 0 | 120 | wrinkled | H | Δ |
| 0 | 0 | 1030 | 0 | 60 | wrinkled | 2B | Δ |
|   |   |   | 0 | 120 | wrinkled | H | Δ |
|   |   | 1350 | 0 | 60 | wrinkled | 3H | Δ |
| 0.48 | 500 | 1030 | 30 | 30 | good | H | Δ |
|   |   |   | 60 | 60 | good | 2H | O |
| 1.07 | 1122 | 1030 | 30 | 30 | good | B | Δ |
|   |   |   | 60 | 60 | good | 2H | O |
| 1.65 | 2227 | 1350 | 10 | 50 | good | 3H | O |
|   |   |   | 30 | 30 | good | 3H | O |
| 5.93 | 1122 | 189 | 30 | 60 | good | HB | Δ |
|   |   |   | 30 | 120 | good | H | Δ |
| 11.78 | 2227 | 189 | 30 | 120 | good | 2H | Δ~O |
|   |   |   | 30 | 210 | good | 2H | Δ~O |

Note 1:
Surface pencil hardness measured with Mitsubishi UNI (trade name).
Note 2:
Represented by the state exhibited after 50 reciprocations of rubbing by flannel cloth saturated by xylene on the coated surface
o : no abnormality was observed
Δ~o : solubilization was scarcely observed
Δ: solubilization was slightly observed

EXAMPLE 2

62.5 parts of urethane modified unsaturated polyester resin composition obtained by Reference Example 7, 25 parts of trimethylolpropane-triacrylate, 62.5 parts of unsaturated polyester composition obtained by Reference Example 8, 2.5 parts of benzoin methylether, 11.9 parts of butylacetate, and 20 parts of Colortex Yellow-NL (manufactured by Sanyo Color Works Ltd.) were dispersed such that particle size thereof was less than 10 microns, and a yellow coating composition was obtained. The composition was applied on a tin plate so that a thickness of dried film falling within a range of from 55 to 60 microns could be obtained, and the coating film was allowed to stand for about 20 minutes at 20° C. The film was then irradiated by the lamps as used in Example 1 under a condition wherein irradiation intensity $E_A$ of the metal halide lamp was 815 W/m$^2$, irradiation intensity $E_B$ of the high-pressure mercury lamp was 963 W/m$^2$, and the ratio $E_A/E_B$ was 0.85 so that the film was thereby cured. The observation of the coating film was shown in Table 2.

EXAMPLE 3

62.5 parts of urethane modified unsaturated polyester resin composition obtained by Reference Example 7, 25 parts of trimethylolpropane-triacrylate. 62.5 parts of unsaturated polyester composition obtained by Reference Example 8, 2.5 parts of benzil, 10.6 parts of butyl acetate, and Collofine red 236 (manufactured by Dainippon Ink and Chemical Incorporation) 15 parts were dispersed such that particle size thereof was less than 10 microns, and a red coating composition was obtained. The composition was applied in the same manner as in Example 2 and cured. The curing condition and the observed result were shown in Table 2.

62.5 parts of urethane modified unsaturated polyester resin composition obtained in Reference Example 7, 25 parts of trimethylolpropane-triacrylate, 62.5 parts of unsaturated polyester composition obtained in Reference Example 8, 2.5 parts of benzoinmethylether, 7.1 parts of butylacetate, and one part of Black Pearl 607 (manufactured by Cabot Corporation) were dispersed such that particle size thereof was less than 10 microns, and a black composition for coating was obtained. The coating composition was applied in the same manner as in Example 2 and cured. The curing condition and the observation thereof were shown in Table 2.

EXAMPLE 5

62.5 parts of urethane modified unsaturated polyester resin composition obtained in Reference Example 7, 25 parts of tetramethylolmethane-tetraacrylate, 62.5 parts of unsaturated polyester composition obtained in Reference Example 8, 1.25 parts of benzoinmethylether, 2.5 parts of benzil, 7.2 parts of butylacetate, and 37.5 parts of titanium oxide (Tipaque R-930, manufactured by Isihara Industry Co.) were dispersed such that grain diameter was less than 10 microns, and a coating composition was thereby obtained. The composition was applied on a tin plate so that the thickness of dried film falled within a range of from 45 to 50 microns, and was allowed to stand for about 20 minutes at the temperature of 20° C. The sample was then cured as described in Example 1, and discoloration (Note 3) of the coated film was observed. The curing condition and the observation were shown in Table 3.

TABLE 2

| Irradiation intensity ratio $E_A/E_B$ | Irradiation intensity of metal halide lamp (W/m$^2$) | Irradiation intensity of high-pressure mercury lamp (W/m$^2$) | Irradiation time (sec.) Metal halide lamp | Irradiation time (sec.) High-pressure mercury lamp | composition | Observed Result Surface condition | Observed Result Hardness (note 1) | Observed Result Solvent resistance (note 2) (note 2) |
|---|---|---|---|---|---|---|---|---|
| | | | | | Example 2 | wrinkled | cannot measured | Δ |
| | | | 0 | 60 | Example 3 | wrinkled | cannot measured | Δ |
| | | | | | Example 4 | wrinkled | cannot measured | |
| 0 | 0 | 936 | | | Example 2 | wrinkled | cannot measured | Δ |
| | | | 0 | 120 | Example 3 | wrinkled | cannot measured | Δ |
| | | | | | Example 4 | wrinkled measured | cannot | Δ |
| | | | | | Example 2 | good | F | Δ |
| | | | 60 | 60 | Example 3 | good | | O |
| | | | | | Example 4 | good | H | Δ~O |
| | | | | | Example 2 | good | H | Δ~O |
| 0.85 | 815 | 936 | 120 | 60 | Example 3 | good | F | O |
| | | | | | Example 4 | good | 2H | O |
| | | | | | Example 2 | good | H | O |
| | | | 300 | 60 | Example 3 | good | H | O |
| | | | | | Example 4 | good | 2H | O |

Note 1:
Surface pencil hardness obtained by Mistubishi UNI (trade name)
Note 2:
Represented by the state exhibited after 50 reciprocations of lapping by flannel cloth saturated by xylene on the coated surface
o :no abnormality was observed
Δ~o :solubilization was scarcely observed
Δ:solubilization was slightly observed

TABLE 3

| Irradiation time (min.) Metal halide lamp | Irradiation time (min.) High-pressure mercury lamp | Intensity of irradiation (W/m$^2$) Metal halide lamp ($E_A$): 251; High-pressure mercury lamp ($E_B$): 540; Ratio ($E_A/E_B$): 0.46 | Intensity of irradiation (W/m$^2$) Metal halide lamp ($E_A$): 502; High-pressure mercury lamp ($E_B$): 540; Ratio ($E_A/E_B$): 0.93 |
|---|---|---|---|
| 0 | 1 | | 0.76 |
| 0 | 3 | | 1.67 |
| 0 | 5 | | 2.19 |
| 1 | 0 | 0.10 | 0.17 |
| 1 | 1 | 0.35 | 0.65 |
| 1 | 3 | 1.43 | 0.80 |
| 1 | 5 | 1.76 | 1.48 |
| 3 | 0 | 0.26 | 0.04 |
| 3 | 1 | 0.59 | 0.30 |
| 3 | 3 | 1.18 | 1.18 |
| 3 | 5 | 1.62 | 1.35 |
| 5 | 0 | 0.20 | 0.10 |
| 5 | 1 | 0.38 | 0.39 |
| 5 | 3 | 1.21 | 0.98 |
| 5 | 5 | 1.37 | 1.01 |

Note 3:
The difference in discolorations for the irradiated film and non-irradiated film was measured by a color difference meter made by Toyo Phisico-Chemical Industry Co. as a value of L,a,b of Hunter's chromaticity index, and the value was converted to NBS unit by an equation:

Color difference $\Delta E = \sqrt{(L_S - I_T)^2 + (a_S - a_T)^2 + (b_S - b_T)^2}$ In the Tables 1 through 3 showing the observation results for the Examples 1 through 5, those irradiated by A light source made by metal halide lamp and also by B light source made by high-pressure mercury lamp were irradiated first by the metal halide lamp, and after the interruption of the same lamp, irradiated by the high-pressure mercury lamp. As disclosed hereinbefore, wavelengths shorter than 300 nm have been substantially eliminated from the rays emitted from the light source A which has an abundance of radiation energy in a range of from about 350 to about 460 nm, and the light source B has an abundance of radiation energy in a range of from about 230 to about 400 nm. Thus, when a composition is firstly irradiated from the light source A, photo-polymerization in the surface portion within the film of the composition is inhibited by the existing oxygen and the deeper portion within the film of the composition is cured. When the film of the composition is thereafter irradiated by the light source B wherefrom an ozone generating range has been eliminated and which has an abundance of radiation energy in a range of from about 230 to about 400 nm, the surface portion within the film of the composition is cured regardless of the existence of oxygen near the surface portion, and glossy and wrinkleless surface of the coated composition can be obtained.

On the other hand, if the composition is firstly irradiated by high-pressure mercury lamp radiating ultraviolet rays in a range of from about 200 to about 400 nm, the curing of the composition proceeds from the surface portion to the deeper portion, and wrinkles are frequently observed on the surface of the composition. The observation results in Examples 1 through 5 verify the above described consideration, and reveal the fact that the photocurable composition can be effectively cured by first irradiation by the light source A and followed by irradiation by the light source B in case where the irradiation intensity $E_A$ of the light source A is not less than 55 W/m$^2$, irradiation intensity $E_B$ of the light source B is not less than 135 W/m$^2$, and the ratio $E_A/E_B$ is in a range of from 0.01 to 20, preferably in a range of from 0.1 to 15. The observation results also indicate that no satisfactory result could be obtained when either one of $E_A$ or $E_B$ is excessively low, that is, when $E_A$ is lower than 55 W/m$^2$ or when $E_B$ is lower than 135 W/m$^2$.

As an apparatus for practicing the curing method according to the present invention as an industrial application, a light source group A and another light source group B may be arranged in forward and afterward parts of a tunnel type irradiation chamber through which the photo-curable composition is continuously transported. In such an arrangement, when it is assumed that the maximum irradiation intensity on the surface of the composition passing through the forward irradiating region or A light source region (extending from the entrance of the chamber to an intermediate position between the lamp of light source group A which is nearest to the light source group B and the lamp of light source group B which is nearest to the light source group A) in a wavelength range of from about 300 to about 460 nm obtained from the light source group A is designated by $E_a$, and the maximum irradiation intensity on the same surface passing through the same region and of wavelengths less than 300 nm obtained from the two light source groups A and B is designated by $E_c$, it is found advantageous that the ratio $E_c/E_a$ is selected to be not more than 0.1.

Although the effects caused on the curing of the composition by a radiation energy for wavelengths less than 300 nm mixed in those irradiated in the A light source region will be described hereinlater, various irregularities are caused in the curing of the photo-curable composition when the ratio $E_c/E_a$ exceeds 0.1, and it is extremely difficult to obtain a good coating film of the composition. The apparatus according to the present invention will now be described with respect to various embodiments thereof.

EXAMPLE 6

Three kinds of photo-curable compositions indicated at (a), (b), and (c) in Note 2 attached to Table 5 indicated hereinafter were uniformly coated on respective tin plates by means of wire wound rod #42, and were cured in an irradiation apparatus illustrated in FIG. 1. In the apparatus, numeral 1 designates the A light source device having a sheet of glass plate 2 attached on the lower surface of the device 1 for shielding shorter ultraviolet rays. Numeral 3 designates the B light source device. In these two light source devices 1 and 3, various light sources as indicated in Table 4 are used. A photo-curable composition 4 is passed through the irradiation apparatus by means of a conveyer 5 which is transported at a speed of, for instance, 50 cm/min.

Figure 2:
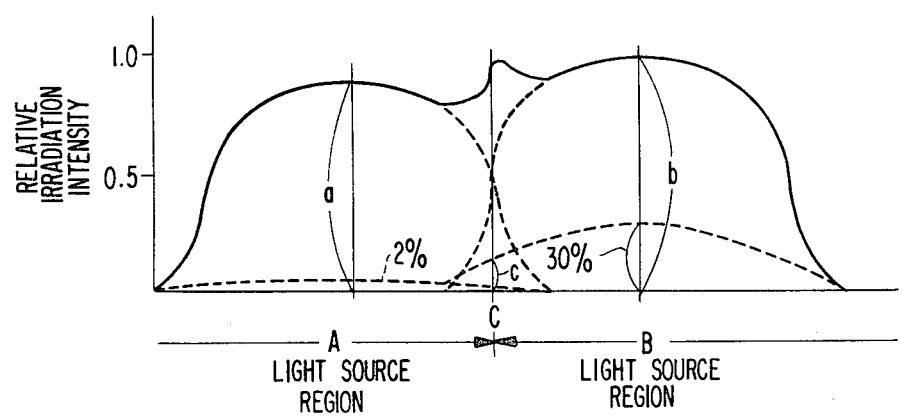
FIG. 2 is a light distribution curve of the device shown in FIG. 1.

Maximum irradiation intensities in a range of from about 300 to about 460 nm obtained from the A light source device 1 and B light source device 3 are designated by $E_a$ and $E_b$, respectively, as shown in FIG. 2. The positions of the light source devices 1 and 3 are varied by varying $H_1$, $H_2$, and L in FIG. 1, so that the ratio of $E_c$ against the aforementioned $E_a$ is thereby varied. The said $E_c$ represent the maximum irradiation intensity for wavelengths less than 300 nm obtained from the two light source devices 1 and 3 in the A light source region. Various experiments were carried out by thus varying the ratio $E_c/E_a$ and the results are shown in Table 5. As shown in FIG. 2 showing light distribution in the apparatus, $E_c$ is generally obtained at an intermediate point C between the two light source devices 1 and 3.

As is apparent from the results of the experiments, a good appearance of the composition could be obtained at a value of the ratio $E_c/E_a$ not more than 0.1.

TABLE 4

| Light source | Lamp output | Remarks | Intensity ratio (note 1) |
| --- | --- | --- | --- |
| A | 2 KW | Quartz made single tube type lamp containing gallium halide (with a sheet of glass plate attached on the lower surface of the lamp for shielding shorter ultravillet rays) | 0.02 |
|  | 2 KW | Ozone preventing quartz made high-pressure mercury lamp of single tube type | 0.3 |

Note 1:
An intensity ratio between the intensity in the wavelengths shorter tha 300 nm and that in a range of from about 300 to about 460 nm.

TABLE 5

| Experiment No. | Distance (cm) | | | (note 1) Irradiation intensity (W/m$^2$) | | (note 1) intensity ratio | Film appearance Composition (note 2) | | |
| --- | --- | --- | --- | --- | --- | --- | --- | --- | --- |
|  | L | H$_1$ | H$_2$ | $E_a$ | $E_c$ | $E_c/E_a$ | (a) | (b) | (c) |
| 1 | 5 | 10 | 10 | 300 | 45 | 0.15 | wrinkle | wrinkle | wrinkle |
| 2 | 8 | 10 | 10 | 300 | 30 | 0.10 | not irregular | not irregular | not irregular |
| 3 | 10 | 10 | 10 | 300 | 15 | 0.05 | not irregular | not irregular | not irregular |
| 4 | 15 | 10 | 10 | 300 | 6 | 0.02 | not irregular | not irregular | not irregulr |

Note 1:

$E_a$: Maximum irradiation intensity (W/m$^2$) in a range of 300 to 460 nm in A light source region.

$E_c$: Maximum irradiation intensity (W/m$^2$) in wavelengths

TABLE 5-continued

| Experiment No. | Distance (cm) L | H₁ | H₂ | (note 1) Irradiation intensity (W/m²) $E_a$ | $E_c$ | (note 1) intensity ratio $E_c/E_a$ | Film appearance Composition (note 2) (a) | (b) | (c) |
| --- | --- | --- | --- | --- | --- | --- | --- | --- | --- |
| | | | | less than 300 nm obtained from A and B light sources in A light source region: | | | | | |
| Note 2: | | | | | | | | | |
| (a) | | | | Aronix M-8060 | | 50 parts | | | |
| | | | | Aronix M-5700 | | 50 | | | |
| | | | | Rutile type titanium oxide | | 30 | | | |
| | | | | Benzil | | 1.5 | | | |
| | | | | Total | | 131.5 | | | |
| (b) | | | | A composition wherein the rutile type titanium oxide in the composition (a) is substituted by red 236 (manufactured by Dainippon Ink and Chemicals Inc.) of 20 parts. | | | | | |
| (c) | | | | A composition wherein the rutile type titanium oxide in the composition (a) is substituted by 10 parts of Blue Pigment prussian blue "N-650 Konjo" (manufactured by Dainichi Seika Industry Co.). (Aronix M-8060, Aronix M-5700 photo-curable composition are manufactured by Toa Gosei Kagaku Co.) | | | | | |

Before entering the description about more concrete examples of the present invention, a conventional construction thereof will be described in brief.

Figure 3A:
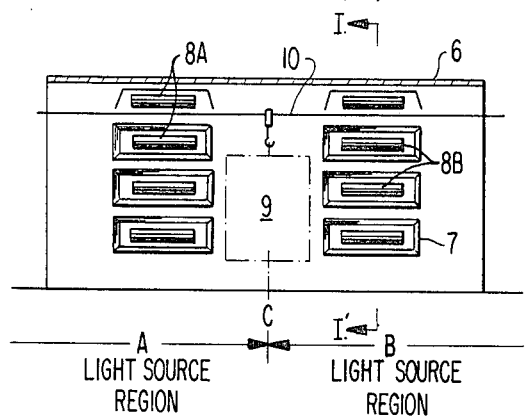
FIGS. 3(a) and 3(b) are a longitudinal sectional view of a conventional photo-curable coating material irradiating device and a sectional view thereof along the line I—I', respectively.
Figure 3B:
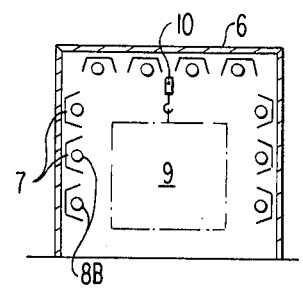

In a construction shown in FIG. 3 adapted to cure compositions coated on a substrate, there are provided two groups of lamps, 8A and 8B, each of the lamps having a reflector 7, arranged on the inner surface of a tunnel type irradiation chamber 6. The substrate 9 coated the composition is supported on a conveyor 10 and is transported continuously along the longitudinal direction of the tunnel type irradiation chamber 6. In this construction, even if the two groups of lamps 8A and 8B are of the types adapted to be used in the present invention, ultraviolet rays of wavelengths shorter than 300 nm are inevitably mixed in the irradiation in the A light source region when lamp groups 8A and 8B are too closely arranged, whereby crinkles or wrinkles are observed on the surface of the coated film. Such an example will further be described with reference to FIG. 4.

Figure 4A:
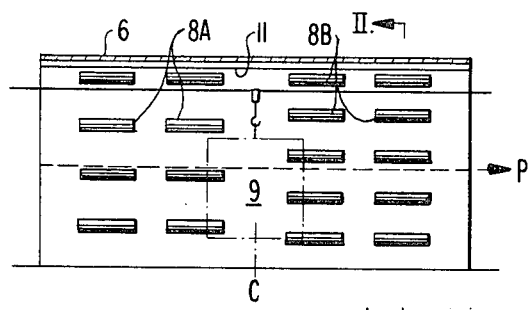
FIGS. 4(a) are a longitudinal sectional view of a reference example thereof and a sectional view along the line II—II', respectively.
Figure 4B:
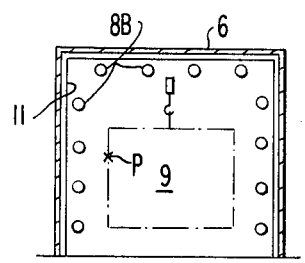
Figure 5:
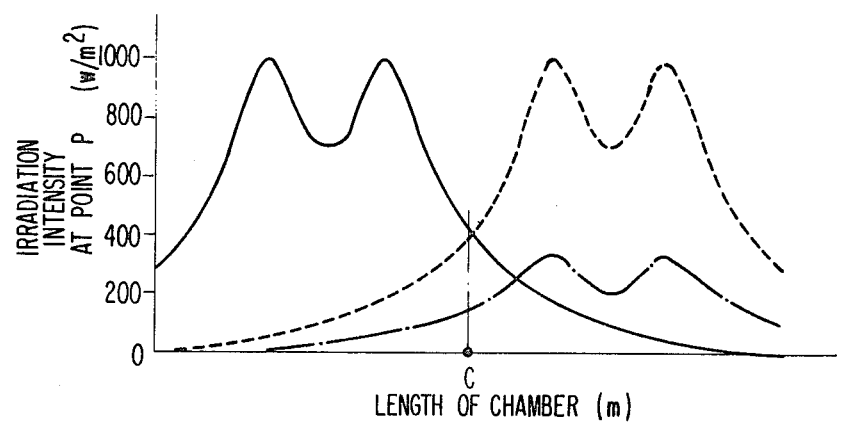
FIG. 5 is a diagram showing a distribution of the irradiation intensity on a point P along the longitudinal direction of the device shown in FIGS. 4(a) and 4(b)

In FIG. 4, light diffusing aluminum reflecting plate 11 is extended along the inner wall of a tunnel type irradiation chamber 6 having a cross-sectional area of 1.2×0.8 m² and a length of 3.6 m, and in the forward stage of the chamber 6, there are provided A light source 8A consisting of 18 metal halide lamps wherein gallium iodide is a principal additive in the inner tube and each of the lamps has an arc length of 5 cm and a lamp wattage of 400 W. These 18 lamps are arranged in two rows at positions departed from the entrance port of the chamber by 0.65 m and 1.3 m, respectively. In the afterward stage of the chamber 6, there are provided B light source 8B consisting of 24 high-pressure mercury lamps, each having an arc length of 7 cm and a lamp wattage of 400 W, also arranged in two rows at positions departed from the exit port of the chamber by 0.65 m and 1.3 m, respectively. The distributions of various irradiation intensities at a point P on the surface of the coated substrate 9 when the latter is conveyed along the longitudinal direction of the chamber 6 are shown in FIG. 5. Within three distribution curves in FIG. 5, one in full line indicates the irradiation intensity from A light source 8A having wavelength in a range of from about 300 to about 460 nm, another in broken line represents the irradiation intensity from B light source 8B having wavelength ranging from about 230 to about 460 nm, and the third in one-dot-chain line is for the irradiation intensity from the two light sources 8A and 8B, and of wavelength less than 300 nm. In this conventional construction of the tunnel type irradiation chamber, the maximum value of a ratio $E_c/E_a$, wherein $E_a$ represents a maximum irradiation intensity of wavelength in a range of from about 300 to about 460 nm in the A light source region, and $E_c$ represents a maximum irradiation intensity of wavelength less than 300 nm produced by the two light sources 8A and 8B, occurs at a point C and the value of the ratio $E_c/E_a$ at this point is found to be 0.15.

When a cylindrical substrate having a diameter of 30 cm and a length of 30 cm and coated with a photo-curable composition is transported on a conveyor through the above described irradiation chamber 6 from A light source side to B light source side at a conveyor speed of 1.2 m/min, the coated composition was found to be completely cured inclusive of the deepest portion but exhibiting wrinkles on the surface of the coated composition.

Preferred embodiments of the apparatus according to the present invention will now be described with reference to FIGS. 6 through 10.

EXAMPLE 7

Figure 6:
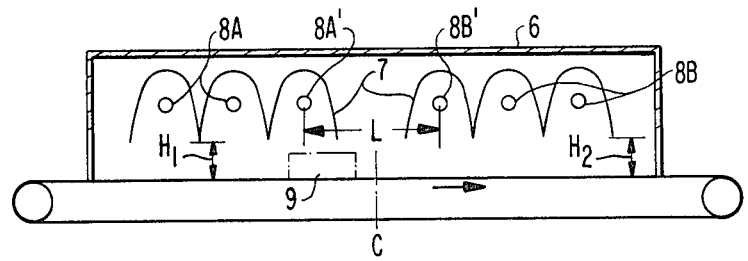
FIG. 6 is an elevation in a longitudinal section of an embodiment according to the present invention.

In an example shown in FIG. 6, A and B light sources 8A and 8B are provided in a tunnel type irradiation chamber 6 at the forward stage and the afterward stage, respectively, and either of the light sources comprises a group of lamps each having a reflector 7. The construction of the irradiation chamber 6 is thus adapted to curing a composition coated on a substrate 9 when the latter is transported on a belt conveyor 5 from the A light source side to the B light source side through the irradiation chamber 6. In this example, the ratio $E_c/E_a$ is varied in accordance with a distance L between two closest neighboring lamps 8A' and 8B' respectively belonging to the A and B light sources, and with $H_1$ and $H_2$ corresponding respectively to distances separating the lower edges of the reflectors from the upper surface of the conveyor 5. When the value of the ratio $E_c/E_a$ is measured for various values of $H_1$, $H_2$, and L, it was found that the ratio $E_c/E_a$ can be maintained not more than 0.1 when $H_2/L$ is kept not more than 1. The reflector 7 is preferably of parabolic or elliptical configuration, and this example is better adapted to curing photocurable composition applied on a flat substrate.

EXAMPLE 8

Figure 7A:
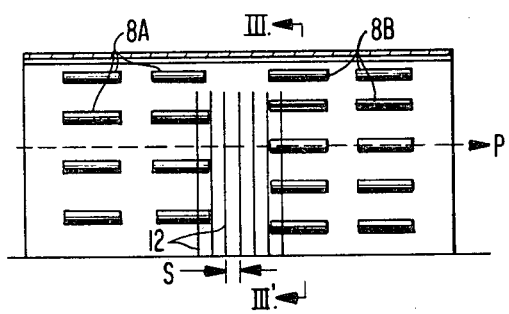
FIGS. 7(a) and 7(b) are a longitudinal section and a cross section along the line III—III' of another embodiment of this invention.
Figure 7B:
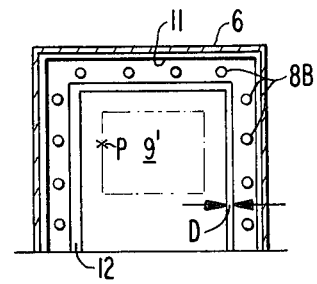
Figure 8:
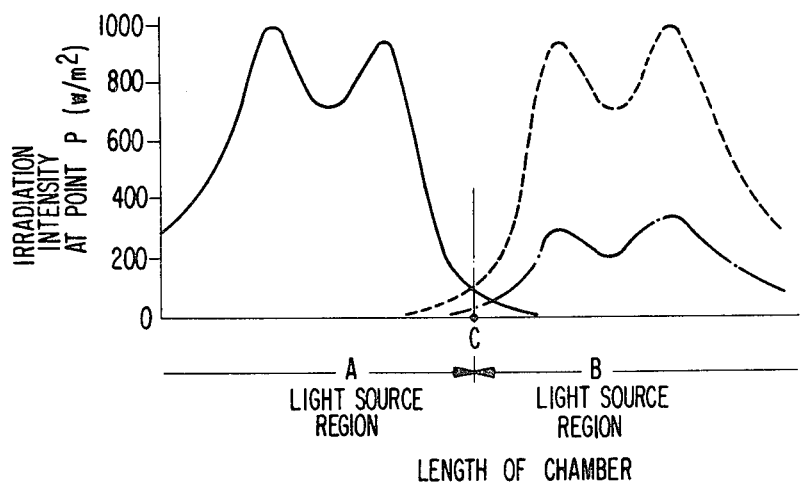
FIG. 8 is a diagram showing a distribution of the irradiation intensity on a point P along the longitudinal section of the device shown in FIGS. 7(a) and 7(b)

In FIG. 7, there is indicated another embodiment of the invention wherein two light sources are provided at positions shown in FIG. 3, and a plurality of louvers 12 each having a thickness of 1 mm and a width of 3 cm are installed to the interior of the chamber 6 in a manner spaced inwardly by 5 cm from the lamps and from each other by 10 cm. The distribution of irradiation intensity obtained at a point P on the coated substrate 9 when the latter is transported along the longitudinal direction of the chamber 6 is shown in FIG. 8. As is apparent from the distribution, the intensity ratio at the point C defined in FIG. 3 is kept at 0.02, the fact indicating that the separation between the light sources A and B is practically sufficient. When a cylindrical substrate coated with a photo-curable composition is irradiated in this chamber as in the case of FIG. 4, the composition can be cured completely with the surface thereof having no crinkles and wrinkles and thus being glassy. The ratio $E_c/E_a$ is mainly affected by the width D and the space S of the louvers, and the tests with various relations between D and S reveal that the louvers having S and D in a relation of $S/D = 0.2$ to 5 are economical and efficient.

EXAMPLE 9

Still another embodiment of the present invention is shown in FIG. 9. In this embodiment, a sheet of aluminum reflecting plate 11 is attached over the entire interior surface of the chamber 6 as in the example shown in FIG. 4, and light reflectors 7 are provided on only those lamps of the B light source arranged in the neighborhood of the A light source region. The spacing angle of reflectors 7 with those lamps is about 20 degree against wall of the exit port of the chamber. In addition, a light shielding plate 13 having a width of 10 cm is provided between the A light source and the B light source. In FIG. 10, there are indicated distributions of irradiation intensities at a point P in FIG. 9, which are obtained when the point is moved along the length of the chamber 6. From the distributions, it is made apparent that the irradiation intensity ratio $E_c/E_a$ is maximum at the point C as defined in FIG. 3. A cylindrical substrate 9 coated with a photo-curable composition was irradiated in the chamber of this example thereby to cure the coated composition, and a result smilar to the example shown in FIG. 7 could be obtained. Tests with various angles other than the above spacing angle of the reflectors revealed than an angle of 10 degrees or more against wall of theoexit port of the chamber can render a most advantageous result.

While the invention has been described in detail and with reference to specific embodiments thereof, it will be apparent to one skilled in the art that various changes and modifications can be made therein without departing from the spirit and scope thereof.

What is claimed is:

1. An apparatus for curing a photo-curable composition comprising a tunnel type irradiation chamber, a group of light source provided in the forward stage of the chamber for irradiating said composition at an irradiation intensity by the rays out of which wavelengths shorter than 300 nm are substantially eliminated and which have an abundance of radiation energy in a range of from about 300 to about 460 nm, and a group of light source provided in the afterward stage of the chamber thereby to irradiate the composition by rays having an abundance of radiation energy in wavelengths range of from about 230 to about 460 nm, and wherein a ratio of a maximum irradiation intensity $E_c$ for the wavelengths less than 300 nm from both groups of the light source to a maximum irradiation intensity $E_a$ from the first group of the light source on the surface of the substrate coated with said composition at the A light source region, that is $E_c/E_a$, is selected to a value not more than 0.1.

2. An apparatus as set forth in claim 1, wherein said group of light source provided in the forward state of the chamber and/or said group of light source provided in the afterward stage of the chamber is provided with reflectors for controlling light distribution, and/or a light shielding plate is provided between the said both groups of light source.

3. The irradiation chamber according to claim 2 wherein both groups of light sources are provided with reflectors and the ratio between (a) the shortest distance separating the light sources of said first group from the light sources of said second group and (b) the distance separating the lower edge of the reflectors from the upper surface of the transport means is not more than 1.

4. An apparatus as set forth in claim 1, wherein reflectors are provided on at least those light sources located in a row nearest to the forward stage within the group of the light source in the afterward stage, and at least reflectors provided on the light sources nearest to the forward stage and also the light sources themselves are tilted against wall of the exit port of the chamber by an angle of 10 degrees or more.

5. The tunnel type irradiation chamber according to claim 1, wherein said group of light sources installed in the forward stage have an abundance of radiation energy in the range of from about 350 to 460 nm.

6. The tunnel type irradiation chamber according to claim 1, wherein said group of light sources installed in the afterward stage have an abundances of radiation energy in the range of from about 230 to about 400 nm.

7. Apparatus for curing a photo-curable composition comprising a tunnel type irradiation chamber, transport means for moving said photo-curable composition through said chamber, a first group of light sources provided in the forward stage of said chamber for first irradiating said composition as it moves through the chamber on said transport means with radiation energy predominantly across the range of from about 300 to about 460 nm, and having substantially no wavelengths shorter than 300 nm, and a second group of light sources in the afterward stage of the chamber for subsequently irradiating said composition as it moves through the chamber on said transport means with radiation energy predominantly across the range of from about 230 to 460 nm, wherein the ratio of the maximum irradiation intensity $E_c$ for wavelengths less than 300 nm from both groups of light sources to the maximum irradiation intensity $E_A$ from the first group of light sources on the surface of said composition in said forward stage of the chamber is not more than 0.1.

8. The irradiation chamber according to claim 7 wherein said first group of light sources emit radiation predominantly across the range from about 350 to about 460 nm.

9. The irradiation chamber according to claim 7, wherein said second group of light sources emit radiation predominantly across the range from about 230 to about 400 nm.

10. The irradiation chamber according to claim 7 wherein either or both of said groups of light sources are provided with reflectors for controlling light distribution.

11. The irradiation chamber of claim 7 wherein louvers of a configuration not disturbing the transport of said photocurable composition are provided in a boundary region between said forward stage and said afterward stage, said louvers having a width D and being separated by a space S, wherein the ratio S/D in a range of from 0.2 to 5.

12. The irradiation chamber of claim 7 wherein said light sources are arranged in a series of rows perpendicular to the direction of said transport and reflectors are provided on at least those light sources of the second group located in a row nearest the light sources of said first group and the light sources are tilted relative to the wall of the exit end of said chamber by an angle of 10 degrees or more.

13. The irradiation chamber according to claim 7 further comprising a light shielding plate between said first and second groups of light sources.

* * * * *